United States Patent [19]

Hall et al.

[11] 4,190,681

[45] Feb. 26, 1980

[54] METHOD OF COATING A POLYCARBONATE SUBSTRATE WITH GLASS

[75] Inventors: Walter L. Hall, Mt. Vernon, Ind.; James S. Humphrey, Jr., Clemmons, N.C.

[73] Assignee: General Electric Company, Pittsfield, Mass.

[21] Appl. No.: 959,883

[22] Filed: Nov. 13, 1978

[51] Int. Cl.² ............................................. B05D 3/06
[52] U.S. Cl. .................................... 427/45.1; 427/51; 427/54.1; 427/164; 427/248 C; 428/412; 428/426
[58] Field of Search ................ 427/54, 162, 163, 164, 427/45, 51, 248 C; 428/412, 426

[56] References Cited

U.S. PATENT DOCUMENTS

| 3,458,342 | 7/1969 | Cormia | 428/412 |
| 3,622,440 | 11/1971 | Snedeker et al. | 428/412 |
| 3,637,416 | 1/1972 | Misch et al. | 428/412 |
| 3,645,779 | 2/1972 | Kienel | 428/412 |
| 3,953,652 | 4/1976 | Addiss et al. | 428/412 |
| 3,991,234 | 11/1976 | Chang et al. | 428/412 |
| 4,052,520 | 10/1977 | Chang et al. | 428/412 |

OTHER PUBLICATIONS

Kirkman "IBM TDB" vol. 20, No. 11B, p. 4946, Apr. 1978.

*Primary Examiner*—John H. Newsome
*Attorney, Agent, or Firm*—Myron B. Kapustij; William F. Mufatti

[57] ABSTRACT

A polycarbonate substrate is provided with an adherent, hard, abrasion and organic solvent resistant thin glass top coat by initially priming the substrate with a primer coating comprised of the photoreaction products of certain polyfunctional acrylic monomers and thereafter vapor depositing under vacuum onto the primed surface a thin glass top layer, the glass being evaporated by means of radio frequency induction heating.

15 Claims, 2 Drawing Figures

U.S. Patent  Feb. 26, 1980  4,190,681
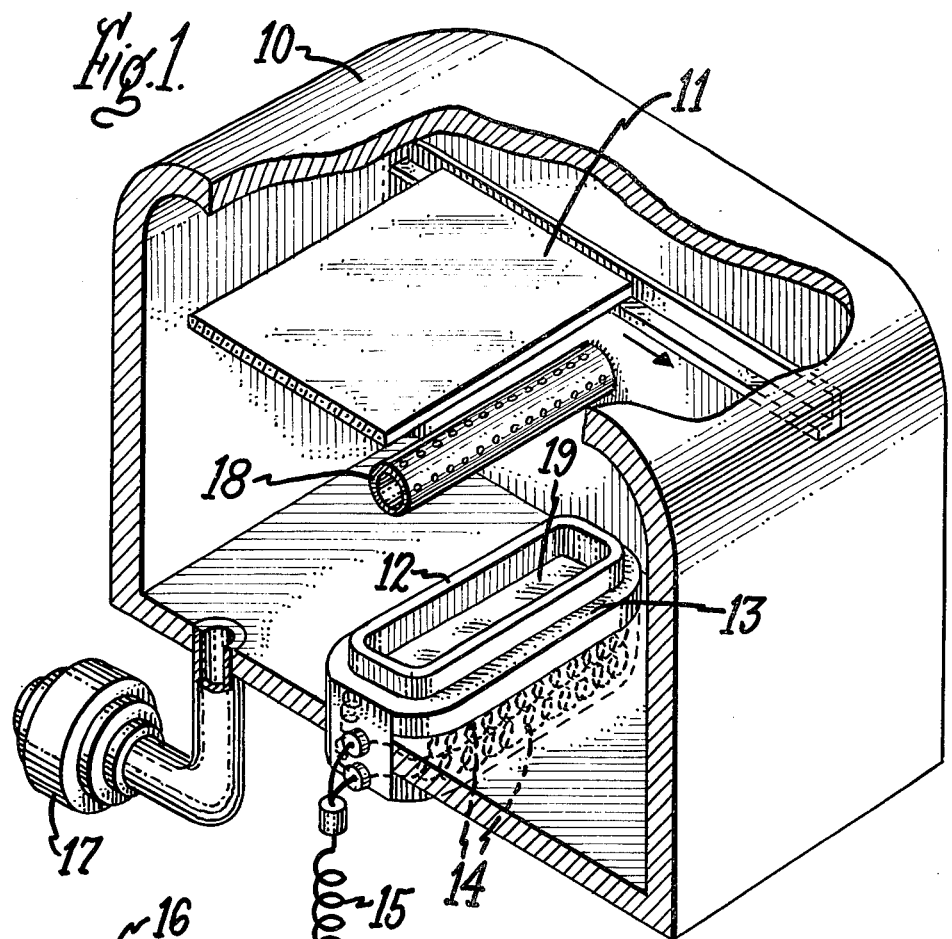
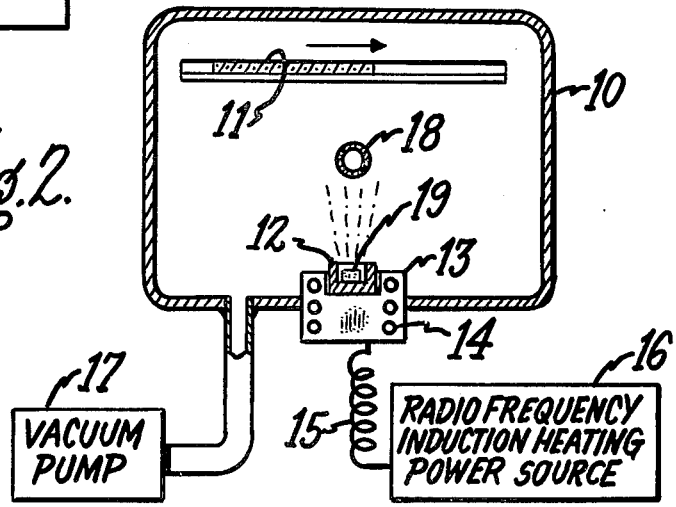

METHOD OF COATING A POLYCARBONATE SUBSTRATE WITH GLASS

SUMMARY OF THE INVENTION

This invention relates to a method of applying a uniform, adherent, hard, abrasion and organic solvent resistant thin glass coating on a polycarbonate substrate. The method comprises first priming the polycarbonate substrate with a primer layer comprised of the photoreaction products of certain polyfunctional acrylate monomer and thereafter vapor depositing on said primed substrate a thin layer of glass, said glass being evaporated by means of radio frequency induction heating.

BACKGROUND OF THE INVENTION

Polycarbonate resins are well known, commercially available materials possessing excellent physical and chemical properties which are useful in a wide variety of applications. Such polymers or resins, since they are less dense and more breakage resistant than glass, have been especially useful as substitutes for glass, as for example, in the manufacture of tail lights and stop light lenses, protective shields for fluorescent street lights, safety shields in inspection windows, windshields, windows, and the like. However, these resins have relatively low mar and chemical solvent resistance.

In order to overcome this relatively low mar and chemical solvent resistance, polycarbonate articles have been coated with various organic and inorganic protective layers which increase the mar resistance of said polycarbonate articles. One type of inorganic protective layer is comprised of glass which has been vapor deposited onto the polycarbonate substrate. Thus, for example, French Pat. No. 1,520,125 and the corresponding British Pat. No. 1,144,099 teach that the surfaces of polycarbonates can be improved, especially rendered more scratch resistant, by vapor depositing an $SiO_2$ layer of at least $1\mu$ thickness onto the polycarbonate. This vapor deposition is accomplished by evaporating $SiO_2$ with an electron beam evaporator source in a high vacuum in the presence of oxygen while regularly moving the polycarbonate article to be coated in the vapor jet and/or the electron beam evaporator source in such a manner that at least 50 successive layers are evaporated onto the surface of the polycarbonate article.

However, this electron beam vapor deposition method suffers from several disadvantages. One of these is due to the electron beam source being, in effect, a point source of $SiO_x$ molecules. Thus, the area of the substrate immediately above the electron beam receives a thicker coating of glass then do the cross peripheral to the point of impingement of the $SiO_x$ molecules. Consequently, to provide a glass coating of uniform thickness a plurality of electron beam sources need be used or, alternately, the single electron beam source must be rapidly oscillated along the width of the substrate. Thus, it is generally difficult to obtain a glass layer of uniform thickness on large substrates utilizing an electron beam evaporator device.

Furthermore, the articles thus prepared have been found to be not entirely satisfactory since, under high stress or temperature changes, the $SiO_2$ protective layer tends to crack and/or separate from the polycarbonate article. In order to overcome this cracking and separation of the protective silicate glass layer, various modifications of the basic vapor deposition process have been proposed. Thus, British Pat. No. 1,313,866 teaches a polycarbonate having a vapor deposited protective layer consisting of $SiO_2$ and 5 to 10% zirconium oxide. Similarly, U.S. Pat. No. 3,645,779 teaches a synthetic polymer provided with a hard, abrasion-resistant surface free of fine hairline cracks by vapor depositing under vacuum onto the surface of said polymer a $B_2O_3$—$SiO_2$ glass containing less than 5 percent by weight of $Na_2O$. U.S. Pat. No. 3,713,869 teaches disposing an intermediate layer between the plastic substrate and the vapor deposited glass layer for the purpose of improving the adherence of said glass layer. This intermediate layer comprises a polymerization layer which is formed by subjecting low-molecular organic vapors to a glow discharge operation and depositing the polymerization products on the substrate. The organic vapors are provided by organic compositions such as acetylene, xylol, and those compounds which contain Si, preferably in an SiO bond, such as silicate acid methyl or silicic acid ethylester, and low boiling siloxanes.

By the method of the instant invention it is possible to obtain vapor deposited glass coatings of uniform thickness and good adhesion on large substrates. By utilizing the method of the present invention it is possible to produce a polycarbonate article having a protective top layer of vapor deposited glass which is free of cracks, is of a uniform thickness and is tenaciously and durably adhered to the polycarbonate substrate. The advantages of the instant invention include the fact that the glass used to form the protective layer need not be of any special composition, as is the case in the afore-mentioned U.S. Pat. No. 3,645,779 and British Pat. No. 1,313,866; that the intermediate primer layer aids in providing solvent protection for the polycarbonate substrate; and that the article produced by the instant method, since the polycarbonate substrate is already coated with the intermediate layer before it is exposed to the vapor deposition process, is relatively easy and simple to manufacture, i.e., the conditions existent during vapor deposition can be more variable than if there were no intermediate layer and if radio frequency induction evaporation were not used.

DESCRIPTION OF THE INVENTION

There is provided by the present invention a method of applying a thin protective glass coating on a polycarbonate article to thereby produce a non-opaque polycarbonate article having improved mar, abrasion, scratch and organic solvent resistance. The method comprises the steps of (i) applying to the polycarbonate substrate an ultraviolet light curable primer composition containing at least one certain polyfunctional acrylate monomer and a photoinitiator; (ii) curing said primer composition by exposure to ultraviolet light for a period of time effective to from a primer layer comprised of the photoreaction products of said polyfunctional acrylate; and (iii) vapor depositing a thin layer of glass on said primed polycarbonate substrate using radio frequency induction heating to vaporize the glass.

In the practice of this invention, any of the aromatic polycarbonates can be employed herein. These are homopolymers and copolymers and mixtures thereof that are prepared by reacting a dihydric phenol with a carbonate precursor. Typical of some of the dihydric phenols that may be employed in the practice of this invention are bisphenol-A (2,2-bis(4-hydroxyphenyl)propane), bis(4-hydroxyphenyl)methane, 2,2-bis(4- hydroxy-3-methylphenyl)propane, 3,3-bis(4-hydroxyphenyl)pentane, 2,2-bis(3,5-dichloro-4-hydroxyphenyl)propane, 2,2-bis(4-3,5-dibromo-4-hydroxyphenyl)propane, bis(3-chloro-4-hydroxyphenyl)methane. Other dihydric phenols of the bisphenol type are also available and are disclosed in U.S. Pat. Nos. 2,999,835, 3,028,365 and 3,334,154.

It is, of course, possible to employ two or more different dihydric phenols or a copolymer of a dihydric phenol with a glycol or with hydroxy or acid terminated polyester, or with a dibasic acid in the event a carbonate copolymer or interpolymer rather than a homopolymer is desired for use in the preparation of the aromatic carbonate polymers of this invention. Also employed in the practice of this invention may be blends of any of the above materials to provide the aromatic carbonate polymer.

The carbonate precursor may be either a carbonyl halide, a carbonate ester or a haloformate. The carbonyl halides which can be employed herein are carbonyl bromide, carbonyl chloride and mixtures thereof. Typical of the carbonate esters which may be employed herein are diphenyl carbonate, di-(halophenyl) carbonates such as di-(chlorophenyl) carbonate, di-(bromophenyl) carbonate, di-(trichlorophenyl) carbonate, di-(tribromophenyl) carbonate, etc., di-(alkylphenyl) carbonate such as di(tolyl) carbonate, etc., di-(naphthyl) carbonate, di-(chloronaphthyl) carbonate, phenyl tolyl carbonate, chlorophenyl chloronaphthyl carbonate, etc., or mixtures thereof. The haloformates suitable for use herein include bis-haloformates of dihydric phenols (bischloroformates of hydroquinone, etc.) or glycols (bishaloformates of ethylene glycol, neopentyl glycol, polyethylene glycol, etc.). While other carbonate precursors will occur to those skilled in the art, carbonyl chloride, also known as phosgene, is preferred.

Also included are the polymeric derivatives of a dihydric phenol, a dicarboxylic acid and carbonic acid. These are disclosed in U.S. Pat. No. 3,160,121 which is incorporated herein by reference.

The aromatic carbonate polymers of this invention may be prepared by employing a molecular weight regulator, an acid acceptor and a catalyst. The molecular weight regulators which can be employed in carrying out the process of this invention include monohydric phenols such as phenol, chroman-I, para-tertiary-butyl-phenol, para-bromophenol, primary and secondary amines, etc. Preferably, phenol is employed as the molecular weight regulator.

A suitable acid acceptor may be either an organic or an inorganic acid acceptor. A suitable organic acid acceptor is a tertiary amine and includes such materials as pyridine, triethylamine, dimethylaniline, tributylamine, etc. The inorganic acid acceptor may be one which can be either a hydroxide, a carbonate, a bicarbonate, or a phosphate of an alkali or alkaline earth metal.

The catalysts which are employed herein can be any of the suitable catalysts that aid the polymerization of bisphenol-A with phosgene. Suitable catalysts include tertiary amines such as, for example, triethylamine, tripropylamine, N,N-dimethyl-aniline, quaternary ammonium compounds such as, for example, tetraethylammonium bromide, cetyl triethyl ammonium bromide, tetra-n-hyptyl-ammonium iodide, tetra-n-propyl ammonium bromide, tetramethyl ammonium chloride, tetramethyl ammonium hydroxide, tetra-n-butyl-ammonium iodide, benzyltrimethylammonium chloride and quaternary phsophonium compounds such as, for example, n-butyltriphenyl phosphonium bromide and methyltriphenyl phosphonium bromide.

Also included herein are branched polycarbonates wherein a polyfunctional aromatic compound is reacted with the dihydric phenol and carbonate precursor to provide a thermoplastic randomly branched polycarbonate.

These polyfunctional aromatic compounds contain at least three functional groups with are carboxyl, carboxylic anhydride, haloformyl or mixtures thereof. Examples of these polyfunctional aromatic compounds which may be employed in the practice of this invention include: trimellitic anhydride, trimellitic acid, trimellityl trichloride, 4-chloroformyl phthalic anhydride, pyromellitic acid, pyromellitic dianhydride, mellitic acid, mellitic anhydride, trimesic acid, benzophenonetetracarboxylic acid, benzophenonetetracarboxylic anhydride and the like. The preferred polyfunctional aromatic compounds are trimellitic anhydride or trimellitic acid, or their haloformyl derivatives.

Also included herein are blends of a linear polycarbonate and a branched polycarbonate.

The intermediate primer layer is formed by just applying a coating composition containing at least one polyfunctional acrylic acid ester monomer onto the polycarbonate substrate and thereafter exposing said polycarbonate substrate with the coating composition thereon to ultraviolet light to cure said composition, thereby forming the intermediate primer layer which contains the polymerized photoreaction products of the polyfunctional acrylic acid ester monomer or monomers which are present in the photocurable coating composition.

The polyfunctional acrylic ester monomers of the present invention are represented by the general formula

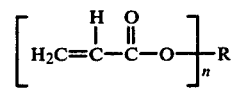

I.

wherein n is an integer from 2 to 8, preferably from 2 to 6, and more preferably from 2 to 4; and R is an n valent hydrocarbon radical, an n valent substituted hydrocarbon radical, an n valent hydrocarbon radical containing at least one ether linkage, and an n valent substituted hydrocarbon radical containing at least one ether linkage.

Preferred n valent hydrocarbon radicals are the n valent aliphatic, preferably saturated aliphatic, hydrocarbon radicals containing from 1 to about 20 carbon atoms and the n valent aromatic hydrocarbon radicals containing from 6 to about 10 carbon atoms.

Preferred n valent hydrocarbon radicals containing at least one ether linkage are the n valent aliphatic hydrocarbon radicals, preferably saturated aliphatic hydrocarbon radicals, containing from 1 to about 5 ether linkages and from 2 to about 20 carbon atoms.

Preferred n valent substituted hydrocarbon radicals are the n valent aliphatic hydrocarbon radicals, preferably the saturated aliphatic hydrocarbon radicals, containing from 1 to about 20 carbon atoms, and the n valent aromatic hydrocarbon radicals containing from 6 to about 10 carbon atoms which contain substituent groups such as the halogens, i.e., fluorine, chlorine, bromine and iodine, hydroxyl, —COOH, and —COOR' groups wherein R' represents alkyl groups containing from 1 to about 6 carbon atoms.

Preferred n valent substituted hydrocarbon radicals containing at least one ether linkage are the n valent aliphatic, preferably saturated aliphatic, hydrocarbon radicals containing from 2 to about 20 carbon atoms and from 1 to about 5 ether linkages which contain substituent groups such as the halogen hydroxyl, —COOH, and —COOR' groups wherein R' is as defined above.

It is to be understood that where substituent groups are present, they should be such that they do not unduly hinder or interfere with the photocure of the polyfunctional acrylic monomers.

The more preferred polyfunctional acrylic monomers are those represented by formula I wherein R is selected from the group consisting of an n valent saturated aliphatic hydrocarbon radical containing from 1 to about 20 carbon atoms, a hydroxyl substituted n valent saturated aliphatic hydrocarbon radical containing from 1 to about 20 carbon atoms, an n valent saturated aliphatic hydrocarbon radical containing from 2 to about 20 carbon atoms and from 1 to about 5 either linkages, and a hydroxyl substituted n valent saturated aliphatic hydrocarbon radical containing from 2 to about 20 carbon atoms and from 1 to about 5 ether linkages.

The preferred polyfunctional acrylate ester monomers are those wherein R is an alkyl, ether or polyether group, with those monomers wherein R is an alkyl group being more preferred.

More particularly, the difunctional acrylic monomers, or diacrylates, are represented by formula I wherein n is 2; the trifunctional acrylic monomers, or triacrylates, are represented by formula I wherein n is 3; and the tetra-functional acrylic monomers, or tetraacrylates, are represented by formula I wherein n is 4.

Illustrative of suitable polyfunctional acrylate ester monomers of formula I are those listed below in TABLE I.

TABLE I

Diacrylates of Formula I

1. $CH_2=CHCOO-CH_2-OOCCH=CH_2$
2. $CH_2=CHCOO-CH_2-CH_2-OOCCH=CH_2$
3. $CH_2=CHCOO-CH_2-CHOHCH_2-OOCCH=CH_2$
4. $CH_2=CHCOO-(CH_2)_6-OOCCH=CH_2$
5. $CH_2=CHCOO-CH_2-CH_2-\underset{\underset{OOCCH=CH_2}{|}}{CH}-CH_3$
6. $CH_2=CHCOO-CH_2CH_2OCH_2CH_2-OOCCH=CH_2$
7. $CH_2=CHCOO-CH_2CH_2OCH_2CH_2OCH_2CH_2OCH_2CH_2-OOCCH=CH_2$
8. $CH_2=CHCOO-CH_2-\underset{\underset{CH_3}{|}}{\overset{\overset{CH_3}{|}}{C}}-OOCCH=CH_2$
9. $CH_2=CHCOO-CH_2-\underset{\underset{CH_3}{|}}{\overset{\overset{CH_2OH}{|}}{C}}-CH_2OCH_2CH_2-OOCCH=CH_2$
10. $CH_2=CHCOO-CH_2-\underset{\underset{CH_3}{|}}{\overset{\overset{CH_2OH}{|}}{C}}-OOCCH=CH_2$
11. $CH_2=CHCOO-CH_2-\underset{\underset{CH_2OH}{|}}{\overset{\overset{CH_2OH}{|}}{C}}-OOCCH=CH_2$ Triacrylates of Formula 1

12. $CH_2=CHCOO-CH_2CH_2\underset{\underset{}{}}{\overset{\overset{OOCCH=CH_2}{|}}{CH}}CH-OOCCH=CH_2$
13. $\begin{array}{c}CH_2=CHCOO-CH_2\\|\\CH_2=CHCOO-CH_2-C-CH_2-CH_3\\|\\CH_2=CHCOO-CH_2\end{array}$
14. $CH_2=CHCOO-CH_2-\underset{\underset{CH_2-OOCCH=CH_2}{|}}{\overset{\overset{CH_2OH}{|}}{C}}-CH_2-OOCCH=CH_2$
15. $CH_2=CHCOO-CH_2CH_2-O-CH_2-\underset{\underset{CH_2-OOCCH=CH_2}{|}}{\overset{\overset{CH_2OH}{|}}{C}}-OOCCH=CH_2$ Tetraacrylates of Formula I 16. $\begin{array}{c}CH_2=CHCOO-CH_2\\|\\CH_2=CHCOO-CH_2-C-CH_2-OOCCH=CH_2\\|\\CH_2=CHCOO-CH_2\end{array}$
17. $CH_2=CHCOO-CH_2-\underset{\underset{CH_2=CHCOO-CH_2CH_2-OOCCH=CH_2}{|}}{CH}-CH-CH_2-OOCCH=CH_2$

TABLE I-continued

18.
$$CH_2=CHCOO-CH_2\underset{\underset{CH_2=CHCOO-CH_2}{|}}{C}HCH-CH_2\underset{\underset{CH_2-OOCCH=CH_2}{|}}{C}H-OOCCH=CH_2$$

These polyacrylate esters and their production are well known to those skilled in the art. One method of producing the di-, tri-, and tetraacrylate esters involves reacting acrylic acid with a di-, tri-, or tetrahydroxyl compound to produce the diester, triester or tetraester. Thus, for example, acrylic acid can be reacted with ethylene glycol to produce ethylene glycol diacrylate (compound 2 in Table I).

Although the coating compositions may contain only one of said polyfunctional acrylate monomers, preferred coating compositions contain a mixture of two polyfunctional monomers, preferably a diacrylate and a triacrylate. When the coating compositions contain a mixture of acrylate monomers, it is preferred that the ratio, by weight, of the diacrylate to the triacrylate be from about 30/70 to about 70/30. Exemplary mixtures of diacrylates and triacrylates include mixtures of hexanediol diacrylate with pentaerythritol triacrylate, hexanediol diacrylate with trimethylolpropane triacrylate, diethyleneglycol diacrylate with pentaerythritol triacrylate, and diethyleneglycol diacrylate with trimethylolpropane triacrylate.

Generally, the coating composition contains from about 70 to about 99 weight percent of the polyfunctional acrylate monomer or mixtures of said monomers. The UV cured coating contains from about 70 to about 99 weight percent of the photoreaction products of the polyfunctional acrylate monomer or mixture of polyfunctional acrylate monomers present in the coating composition.

The photocurable coating composition also contains a photosensitizing amount of photosensitizer, i.e., an amount effective to effect the photocure of the coating composition. Generally, this amount is from about 0.01% to about 10% by weight, preferably from about 0.1% to about 5% by weight of the photocurable coating composition. These additives and the cure thereof are generally well known in the art. Some nonlimiting examples of these UV radiation photosensitizers include ketones, such as benzophenone, acetophenone, benzil, benzyl methyl ketone; benzoins and substituted benzoins such as benzoin methyl ether, α-hydroxymethyl benzoin isopropyl ether; halogen containing compounds such as α-bromoacetophenone, p-bromoacetophenone, α-chloromethylnaphthalene, and the like.

The coating composition of the instant invention may also optionally contain various flatting agents, surface-active agents, thixotropic agents, and UV light absorbers. All of these additives and the use thereof are well known in the art and do not require extensive discussions. Therefore, only a limited number will be referred to, it being understood that any compounds possessing the ability to function in such a manner, i.e., as a flatting agent, surface-active agent, UV light absorber, and the like, can be used so long as they do not deleteriously affect the photocuring of the coating compositions and do not adversely affect the non-opaque character of the coating.

The various surface-active agents, including anionic, cationic and nonionic surface-active agents are described in *Kirk-Othmer Encyclopedia of Chemical Technology*, Vol. 19, Interscience Publishers, New York, 1969, pp. 507–593, and *Encyclopedia of Polymer Science and Technology*, Vol. 13, Interscience Publishers, New York, 1970, pp. 477–486, both of which are references and incorporated herein.

In a preferred embodiment of the instant invention, the coating compositions contain resorcinol monobenzoate. The resorcinol monobenzoate is present in an amount, based upon the weight of the coating composition, exclusive of any additional solvent which may optionally be present, of from about 1 to about 20 weight percent, preferably from about 3 to about 15 weight percent. The preferred UV cured coating thus contains, in addition to the afore-described photoreaction products of at least one polyfunctional acrylic monomer, from about 1 to about 20% by weight of the photoreaction products of resorcinol monobenzoate, which products are formed during the UV cure of the UV curable coating composition.

The glass coated polycarbonate articles having the preferred intermediate primer layers, i.e., those intermediate primer layers formed by the ultraviolet light cure of the intermediate coating composition containing resorcinol monobenzoate, have superior adhesion of the vapor deposited glass protective layer to the polycarbonate substrate, especially after exposure to weathering, compared to glass coated polycarbonate articles having intermediate primer layers formed by the ultraviolet light cure of intermediate coating compositions without the resorcinol monobenzoate.

In the practice of the present invention, the intermediate photocurable coating compositions are first formulated by adding together the polyfunctional acrylic monomer or mixtures thereof, the UV photosensitizer, resorcinol monobenzoate, and, optionally, any of the other aforementioned additives. Additionally, if so desired to reduce the viscosity of the coating formulation, an organic solvent, such as an alcohol, may optionally be incorporated into the formulation. Generally, the amount of solvent, if any, present should be such that evaporation of the solvent occurs before any deleterious effect on the substrate due to the aggressiveness (in the chemical etching sense) of the coating composition develops. The various components are thoroughly mixed so as to form a generally homogeneous coating composition. A thin, uniform coating of the coating solution is then applied onto the polycarbonate surface by any of the known means such as dipping, spraying, roll-coating and the like. The coating is then cured in an inert, e.g., nitrogen, atmosphere by irradiation with ultraviolet light which can have a wavelength of from 1849 A. to 4000 A. The lamp systems used to generate such radiation can consist of ultraviolet lamps which can consist of discharge lamps, as for example, xenon, metallic halide, metallic arc, such as low or high pressure mercury vapor discharge lamp, etc., having operating pressures of from as low as a few milli-torr up to about 10 atmospheres, can be employed. By curing is meant both polymerization of the polyfunctional acrylic monomers and cross-linking of the polymers to form hard, non-tacky intermediate primer coatings.

The cured intermediate primer layer has a thickness of from about 0.1 mils to about 10 mils, preferably from about 0.2 mils to about 5 mils.

After the polycarbonate substrate has been primed by the application thereon of the intermediate primer coating composition and the cure of said coating composition by exposure to ultraviolet light, a thin layer of glass is vapor deposited onto said primed substrate using radio frequency induction heating to evaporate the glass.

The glass which can be deposited by vapor deposition onto the primed polycarbonate substrate generally consists mainly of $SiO_2$. Other types of glass, however, can also be the protective top layer in accordance with the present invention. Examples of these other types of hard inorganic glass include a glass consisting of $SiO_2$, $B_2O_3$, $AL_2O_3$ and $Na_2O$; $HfO_x$; $ZrO_2$; and the like.

BRIEF DESCRIPTION OF THE DRAWING

In describing the vapor deposition of the glass coating reference will be made to the two figures of the drawings which illustrate in perspective and diagrammatically a preferred embodiment of the arrangement for practicing the method of the invention.

The primed polycarbonate substrate 11, in this case a polycarbonate panel with the cured primer layer 20 in one side thereof is placed in a vacuum vessel 10. The vacuum vessel contains a graphite crucible 12 demountably located in a ceramic receptacle 13 having radio frequency induction coils 14 mounted therein. The material to be volatilized 19, e.g., quartz, is placed in the crucible. The crucible is positioned so that its longitudinal axis is transverse to the longitudinal axis and direction of travel of the polycarbonate panel thereby enabling the volatilized quartz material to be evenly deposited across the entire width of the polycarbonate panel as it passes over the crucible. Preferably, the crucible is positioned at a distance of about 10 inches below the polycarbonate sheet. The coils 14 are connected by means of power cells to a power supply service 16. The power supply source is a commercially available unit sold by Applied Materials, Inc., California, under the tradename Pachydyne ® 50 Induction Heating Power Supply rated at 50 Kw/50 $KH_z$. A vacuum system including a diffusion oil pump, is connected to the vacuum vessel to provide the necessary low pressures needed. Generally, these pressures are in the range of from about $10^{-4}$ to about $10^{-6}$ mm Hg. The vacuum vessel may optionally contain member 18 which may be in the shape of a hollow cylindrical member having a plurality of small openings therein used for the introduction of oxygen into the vacuum chamber during the vapor deposition of the glass coating on the primed polycarbonate panel.

In the practice of the method of the present invention the primed polycarbonate panel 11 is placed into the vacuum chamber 10 with the side of said panel containing the primer layer 20 disposed facing the crucible 12 which contains a supply of quartz. The chamber is then evacuated until a pressure of about $10^{-4}$ to about $10^{-6}$ mm of Hg is achieved. The coils 14 are then energized to melt the quartz and the polycarbonate panel is transported over the crucible in the direction indicated by the arrow, i.e., a direction transverse to the longitudinal axis of the crucible. The stream of vaporized $SiO_x$ particles then impinges upon and adheres to the primed polycarbonate panel. Oxygen can be introduced into the vacuum chamber 10 by means of the hollow cylindrical member 18 to insure conversion of the $SiO_x$ stream to $SiO_2$. The rate of movement of the polycarbonate panel over the crucible can be varied so as to achieve the desired thickness of the $SiO_2$ coating thereon, i.e., the greater the rate of transport the thinner the $SiO_2$ layer, the lower the rate of transport the thicker the $SiO_2$ layer. Generally, the thickness of the $SiO_2$ layer ranges from about 1 to about 10 microns, preferably from about 2 to about 7 microns.

PREFERRED EMBODIMENTS OF THE INVENTION

In order to more fully and clearly illustrate the present invention, the following specific examples are presented. It is intended that the examples be considered as illustrative of rather than limiting the invention disclosed and claimed herein.

EXAMPLE 1 an aromatic polycarbonate is prepared by reacting 2,2-bis(4-hydroxyphenyl)propane and phosgene in the presence of an acid acceptor and a molecular weight regulator and having an intrinsic viscosity of 0.57. The product is then fed into an extruder, which extruder is operated at about 265° C. and the extrudate is comminuted into pellets.

EXAMPLE 2

An intermediate coating composition is prepared by blending together 50 parts by weight of ethyleneglycol diacrylate, 50 parts by weight of pentaerythritol triacrylate, 2 parts by weight of $\alpha,\alpha$-diethoxyacetophenone, 5 parts by weight of resorcinol monobenzoate, and 0.5 parts by weight of a silicone oil type surface-active agent produced by Mallincrodt Chemical Co. of New Jersey under the designation, BYK-200. A film of about 12.5 microns thickness of this coating composition is applied to the polycarbonate panels prepared substantially in accordance with Example 1 using a wire-wound drawdown bar. The coated polycarbonate panels are then passed through a Linde photocuring apparatus (this consists of a variable speed conveyor running through a chamber containing germicidal type mercury vapor lamps which emit light mainly at 2537 A°, 3150 A° and 3605 A° operating in air) wherein the nitrogen pressure is 25 psi nitrogen and the speed of the conveyor is 50 ft/min. The resulting primer coating is hard and tack-free.

EXAMPLE 3

A polycarbonate test panel prepared substantially in accordance with Example 1 is placed into a vacuum deposition chamber containing a crucible about which is disposed a radio frequency induction coil, said coil being connected to a power supply source. The power supply source is a commercially available unit sold by Applied Materials, Inc., California, under the tradename, Pachydyne ® 50 Induction Heating Power Supply rated at 50 Kw 50 $KH_z$. This power supply source is operated at between 15-30 Kw. The crucible, to which quartz is added, is located at a distance of 10 inches below the polycarbonate sheet. The crucible is positioned so that its longitudinal axis is transverse to the longitudinal axis and the direction of travel of the polycarbonate test panel thereby enabling the volatilized quartz material to be evenly deposited across the entire width of the test panel as it passes over the crucible. The vacuum deposition chamber is maintained at a pressure of approximately $1\times10^{-4}$ mm Hg and the polycarbonate test panel is transported across the crucible at a rate of 1 foot per minute. A coating of silicon dioxide 3 microns thick is evenly and uniformly deposited on the polycarbonate panel.

EXAMPLE 4

A polycarbonate test panel prepared substantially in accordance with Example 1 and precoated substantially in accordance with Example 3 is placed into a vacuum deposition chamber containing a crucible about which is disposed a radio frequency induction coil, said coil being connected to a Pachydyne ® 50 Induction Heating Power Supply operating at between 15-30 Kw. The crucible, which contains quartz, is located 10 inches below the polycarbonate test panel. The crucible is positioned so that its longitudinal axis is transverse to the longitudinal axis and the direction of travel of the polycarbonate test panel thereby enabling the volatilized quartz stream to evenly impinge upon the size of the polycarbonate panel facing the crucible and resulting in a silicon dioxide layer which is evenly and uniformly deposited across the entire width of the test panel as it passes over the crucible. The vacuum deposition chamber is maintained at a pressure of approximately $1\times10^{-4}$ mm Hg and the polycarbonate test panel is transported across the crucible at a rate of 1 foot per minute. A coating of silicon dioxide 3 microns thick is evenly and uniformly deposited on the precoated polycarbonate test panel.

The glass coated polycarbonate panels prepared in accordance with Examples 3 and 4 are subjected to a series of tests to determine the durability of adhesion of the glass coat, protection afforded the polycarbonate substrate by the glass coating against attack by organic solvents, and the abrasion resistance of the glass coating.

The test to determine the durability of the glass coating involves subjecting the glass coated samples to a humidity test. This humidity test involves subjecting the glass coated samples to a number of humidity oven cycles, and after each cycle subjecting said samples to a scribed adhesion test. One humidity oven cycle consists of placing the sample into a cabinet maintained at 99% relative humidity and 80°-85° F., raising the temperature to 140° F., maintaining the temperature at 140° F. for 6 hours, and thereafter lowering the temperature to 80°-85° F., at which time one cycle is complete and the sample is removed and subjected to the scribed adhesion test. The scribed adhesion test consists of using a multiple blade tool to cut parallel grooves about 1 mm apart through the coating into the polycarbonate substrate, rotating the sample 90° and repeating the cutting process thereby forming a grid pattern of 1 mm squares cut into the coating and substrate, and applying an adhesive tape over the cross-hatched area and quickly pulling said tape off. A sample fails the adhesion test if any of the coating on any of the squares is pulled off. The results of this test are set forth in Table II.

TABLE II

| | Humidity Test |
|---|---|
| Example No. | No. of cycles in humidity oven after which sample fails scribed adhesion test |
| 3 | 1 |

TABLE II-continued

| | Humidity Test |
|---|---|
| Example No. | No. of cycles in humidity oven after which sample fails scribed adhesion test |
| 4 | Passes adhesion test after 10 cycles |

The determination of the protection afforded against solvent attack of the polycarbonate substrate by the glass coating is accomplished by stressing an uncoated sample and the glass coated samples to about 1,000 psi, and thereafter contacting for a period of 15 minutes the uncoated sample and the glass coated surface of the coated samples with a solvent mixture comprised, in parts by volume, of 100 parts methylene chloride, 100 parts chloroform, 5 parts methylethyl ketone, and 25 parts benzyl alcohol. After the 15 minute exposure to the solvent mixtures, the samples are air dried and subjected to visual observation. The results are set forth in Table III.

TABLE III

| Example No. | Results of Visual Observation |
|---|---|
| 1 | Extreme cloudiness of sample due to etching and surface pitting as a result of surface chemical attack by solvent mixture. |
| 3 | Moderate cloudiness of sample due to etching and surface pitting as a result of surface chemical attack by solvent mixture. |
| 4 | Clear sample indicating no etching or surface pitting of polycarbonate substrate by solvent mixture. |

The abrasion test is one wherein test panels having a ¼ inch diameter hole cut in the center are subjected to a Taber Abraser. The Taber Abraser is equipped with CS-10F wheels which are resurfaced every 200 cycles by abrading for 25 cycles on an S-11 refacing disc. The weights used in combination with the CS-10F wheels are 500 gm. weights. Initial measurements of the % Haze are made at four places around the future wear track of the sample using a Gardner Hazemeter. The sample is abraded for 100 cycles, cleaned with isopropanol, and the % Haze is remeasured at the same four places. The four differences in % Haze are calculated and averaged to give the $\Delta\%$ Haze. The results are set forth in Table IV.

TABLE IV

| Abrasion Resistance | |
|---|---|
| Example No. | $\Delta\%$ Haze |
| 1 | 34 |
| 3 | 4.1 |
| 4 | 3.5 |

As can be seen from Table IV, the protection provided the polycarbonate substrate by a glass coating vapor deposited upon a primed polycarbonate panel is substantially the same as that provided by a glass coating vapor deposited on an unprimed polycarbonate panel. However, as seen from Tables II and III, the glass coating which is vapor deposited on a polycarbonate panel primed in accordance with the present invention results in a coating having a much superior durability after exposure to humidity and provides a much greater degree of solvent resistance than does a glass coating which is vapor deposited on a polycarbonate panel which is not primed. This results in a glass coated polycarbonate panel which can be utilized successfully in many commercial applications.

Having now fully described the invention, it will be apparent to one of ordinary skill in the art that many changes and modifications can be made thereto without departing from the spirit or scope of the invention as set forth herein.

What is claimed is:

1. A method of producing a shaped non-opaque polycarbonate article having improved mar, abrasion, scratch and organic solvent resistance comprising the steps of:
   (i) applying onto a polycarbonate substrate in ultraviolet light curable primer composition containing at least one polyfunctional acrylic monomer represented by the general formula

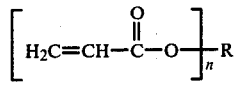

wherein n is an integer having a value of from 2 to 4, and R is an n valent hydrocarbon radical, n valent substituted hydrocarbon radical, n valent hydrocarbon radical containing at least one ether linkage, or an n valent substituted hydrocarbon radical containing at least one ether linkage, and a photoinitiator;
   (ii) exposing said polycarbonate substrate containing said primer composition to ultraviolet light for a period of time sufficient to effectuate a cure of said primer composition, thereof producing a cured primer layer on said polycarbonate substrate; and
   (iii) vapor depositing, under vacuum conditions, and using radio frequency induction heating means, a thin layer containing $SiO_2$ onto said primed polycarbonate substrate.

2. The method according to claim 1 wherein said primer composition further contains resorcinol monobenzoate.

3. The method according to claim 1 wherein said vacuum conditions comprise a pressure of from about $10^{-4}$ to about $10^{-6}$ mm Hg.

4. The method according to claim 3 wherein said vapor deposition occurs in the presence of oxygen.

5. The method according to claim 2 wherein said n valent hydrocarbon radical is an n valent aliphatic hydrocarbon radical, said n valent substituted hydrocarbon radical is an n valent substituted aliphatic hydrocarbon radical, said n valent hydrocarbon radical containing at least one ether linkage is an n valent aliphatic hydrocarbon containing at least one ether linkage, and said n valent substituted hydrocarbon radical containing at least one ether linkage is an n valent substituted aliphatic hydrocarbon radical containing at least one ether linkage.

6. The method according to claim 5 wherein said n valent aliphatic hydrocarbon radical and n valent substituted aliphatic hydrocarbon radical contain from 1 to about 20 carbon atoms.

7. The method according to claim 6 wherein said n valent aliphatic hydrocarbon radical containing at least one ether linkage and n valent substituted aliphatic hydrocarbon radical containing at least one ether linkage contain from 2 to about 20 carbon atoms and from 1 to about 5 ether linkages.

8. A method for producing a uniform and adherent surface layer containing $SiO_2$ on a polycarbonate substrate which comprises:
   (i) applying onto said polycarbonate substrate an ultraviolet light curable primer composition containing at least one polyfunctional acrylic monomer represented by the general formula

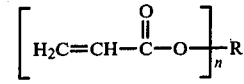

wherein n is an integer having a value of from 2 to 4, and R is an n valent hydrocarbon radical, n valent substituted hydrocarbon radical, n valent hydrocarbon radical containing at least one ether linkage, or an n valent substituted hydrocarbon radical containing at least one ether linkage, and a photoinitiator;
   (ii) exposing said primer composition to ultraviolet light for a period of time effective to photocure said primer composition to a cured primer layer; and
   (iii) vapor depositing, under vacuum conditions, and using radio frequency induction heating means, a thin layer containing $SiO_2$ onto said primer polycarbonate substrate.

9. The method according to claim 8 wherein said primer composition further contains resorcinol monobenzoate.

10. The method according to claim 8 wherein said vacuum conditions comprise a pressure of from about $10^{-4}$ to about $10^{-6}$ mm Hg.

11. The method according to claim 10 wherein said vapor deposition occurs in the presence of oxygen.

12. The method according to claim 9 wherein said n valent hydrocarbon radical is an n valent aliphatic hydrocarbon radical, said n valent substituted hydrocarbon radical is an n valent substituted aliphatic hydrocarbon radical, said n valent hydrocarbon radical containing at least one ether linkage is an n valent aliphatic hydrocarbon radical containing at least one ether linkage, and said n valent substituted hydrocarbon radical containing at least one ether linkage is an n valent substituted aliphatic hydrocarbon radical containing at least one ether linkage.

13. The method according to claim 12 wherein said n valent aliphatic hydrocarbon radical and n valent substituted aliphatic hydrocarbon radical contain from 1 to about 20 carbon atoms.

14. The method according to claim 13 wherein said n valent aliphatic hydrocarbon radical containing at least one ether linkage and said n valent substituted aliphatic hydrocarbon radical containing at least one ether linkage contain from 2 to about 20 carbon atoms and from 1 to about 5 ether linkages.

15. The method according to claim 12 wherein said primer coating composition contains ethyleneglycol diacrylate and pentaerythritol triacrylate.

* * * * *